US012125556B2

(12) United States Patent
Haywood et al.

(10) Patent No.: US 12,125,556 B2
(45) Date of Patent: Oct. 22, 2024

(54) DATA BUFFER FOR MEMORY DEVICES WITH MEMORY ADDRESS REMAPPING

(71) Applicant: Rambus Inc., San Jose, CA (US)

(72) Inventors: Christopher Haywood, Cary, NC (US); Steven C. Woo, Saratoga, CA (US)

(73) Assignee: Rambus Inc., San Jose, CA (US)

( * ) Notice: Subject to any disclaimer, the term of this patent is extended or adjusted under 35 U.S.C. 154(b) by 144 days.

(21) Appl. No.: 17/897,439

(22) Filed: Aug. 29, 2022

(65) Prior Publication Data

US 2023/0072394 A1 Mar. 9, 2023

Related U.S. Application Data

(60) Provisional application No. 63/241,667, filed on Sep. 8, 2021.

(51) Int. Cl.
*G11C 7/10* (2006.01)

(52) U.S. Cl.
CPC .......... *G11C 7/1084* (2013.01); *G11C 7/1012* (2013.01); *G11C 7/109* (2013.01)

(58) Field of Classification Search
CPC ........... G11C 5/04; G11C 7/02; G11C 7/1006; G11C 7/1012; G11C 7/1057; G11C 7/1084; G11C 7/109; G06F 12/0284; G06F 12/0292; G06F 12/0607; G06F 12/1408

USPC ..................................................... 365/189.05
See application file for complete search history.

(56) References Cited

U.S. PATENT DOCUMENTS

| | | | |
|---|---|---|---|
| 4,791,559 A * | 12/1988 | Byers | G06F 15/8053 712/213 |
| 7,110,400 B2 | 9/2006 | Hronik | |
| 7,380,092 B2 | 5/2008 | Perego et al. | |
| 8,185,711 B2 | 5/2012 | Lee et al. | |
| 8,898,415 B2 | 11/2014 | Gillingham | |
| 2008/0080261 A1 * | 4/2008 | Shaeffer | H01L 25/105 365/189.05 |
| 2012/0191943 A1 | 7/2012 | Ware | |
| 2014/0331223 A1 * | 11/2014 | Lee | G06F 13/105 718/1 |

* cited by examiner

*Primary Examiner* — Ly D Pham
(74) *Attorney, Agent, or Firm* — AMSEL IP LAW PLLC; Jason Amsel (57) ABSTRACT

A memory system includes a memory controller, a plurality of serial data buffers, and a plurality of memory devices. The memory controller issues packetized commands and data to the serial data buffers. The serial data buffers each apply a different remapping function to remap an input command address in the packetized commands to respective remapped memory addresses that are different for each serial data buffer. The serial data buffers then issue commands to the memory devices using the remapped addresses. The remapping functions may be designed to mitigate row hammer effects. The serial data buffers may furthermore apply transformations to read and write data to facilitate encryption and decryption.

16 Claims, 7 Drawing Sheets

| | Frame contents | |
|---|---|---|
| 0 | HDR[3] | HDR[2] |
| 1 | HDR[1] | HDR[0] |
| 2 | CID2/DDPID | CID3/R17 |
| 3 | CID0 | CID1 |
| 4 | BG1 | BG2 |
| 5 | BA1 | BG0 |
| 6 | R16 | BA0 |
| 7 | R14 | R15 |
| 8 | R12 | R13 |
| 9 | R10 | R11 |
| 10 | R8 | R9 |
| 11 | R6 | R7 |
| 12 | R4 | R5 |
| 13 | R2 | R3 |
| 14 | R0 | R1 |
| 15 | C9 | C10 |
| 16 | C7 | C8 |
| 17 | C5 | C6 |
| 18 | C3 | C4 |
| 19 | RFU | C2/RFU (BL16) |

FIG. 5

| | | | | Downstream Frame encoding | |
|---|---|---|---|---|---|
| HDR[3] | HDR[2] | HDR[1] | HDR[0] | Command | Frame contents |
| 1 | 1 | 0 | 0 | DRAM Read | CID/BG/BA/RA/CA |
| 1 | 0 | 0 | 0 | DRAM Write | CID/BG/BA/RA/CA |
| 1 | 1 | 0 | 1 | RFU/SDB | |
| 1 | 0 | 0 | 1 | DRAM Write Pattern | CID/BG/BA/RA/CA |
| 1 | 1 | 1 | 0 | SDB register write | Register address |
| 1 | 0 | 1 | 0 | Data payload (BL8/BL16L) | Write data |
| 1 | 1 | 1 | 1 | SDB register read | Register address |
| 1 | 0 | 1 | 1 | Data payload (BL16H) | Write data |
| 0 | 1 | 0 | 0 | MRR | MRA |
| 0 | 0 | 0 | 0 | MRW | MRA/OP |
| 0 | 1 | 0 | 1 | RFU/SDB | |
| 0 | 0 | 0 | 1 | Refresh | ab/sb/pb |
| 0 | 1 | 1 | 0 | RFU/SDB | |
| 0 | 0 | 1 | 0 | Misc | Vref/MPC/OP |
| 0 | 1 | 1 | 1 | RFU/SDB | |
| 0 | 0 | 1 | 1 | Power control | PDE/PDX/SRE/SRX/SREF |

DATA BUFFER FOR MEMORY DEVICES WITH MEMORY ADDRESS REMAPPING

CROSS-REFERENCE TO RELATED APPLICATIONS

This application claims the benefit of U.S. Provisional Patent Application No. 63/241,667 filed on Sep. 8, 2021, which is incorporated by reference herein.

BACKGROUND

Memory systems typically include a memory controller and a memory module having one or more memory devices. The memory controller sends commands to the memory module to facilitate writing data to the memory devices and reading data from the memory devices.

BRIEF DESCRIPTION OF THE DRAWINGS

The teachings of the embodiments herein can be readily understood by considering the following detailed description in conjunction with the accompanying drawings.

DETAILED DESCRIPTION

A memory system includes a memory controller, a plurality of serial data buffers, and a plurality of memory devices. The memory controller issues packetized commands and data to the serial data buffers. The serial data buffers each apply a different remapping function to remap an input command address in the packetized commands to respective remapped memory addresses that are different for each serial data buffer. The serial data buffers then issue commands to the memory devices using the remapped addresses. The remapping functions may be designed to mitigate row hammer effects. The serial data buffers may furthermore apply transformations to read and write data to facilitate encryption and decryption.

Figure 1:
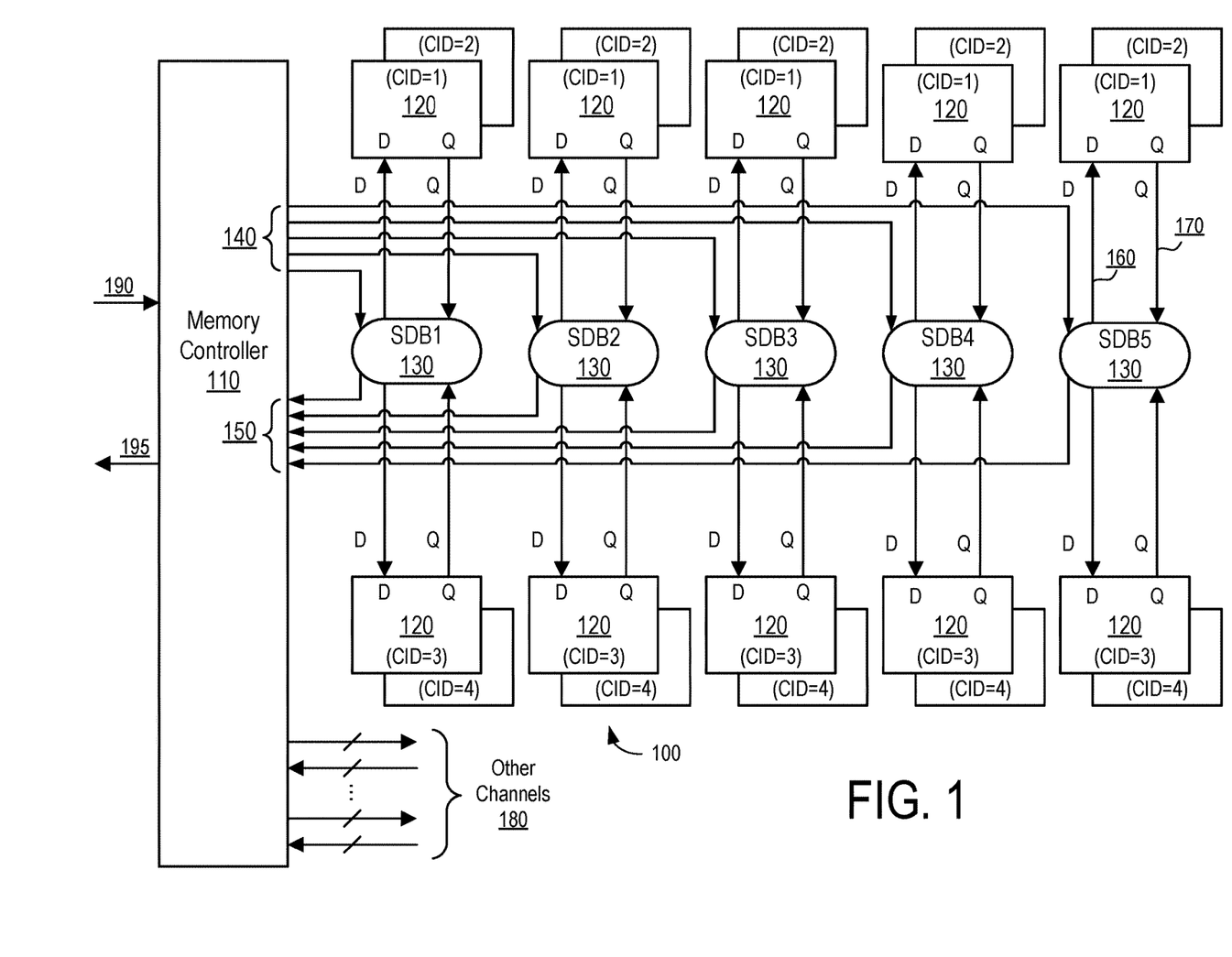
FIG. 1 is a block diagram illustrating an example embodiment of a memory system.

FIG. 1 illustrates an embodiment of a memory system 100 comprising a memory controller 110, a plurality of serial data buffers 130, and a plurality of memory devices 120. In one embodiment, the memory controller 110, the serial data buffers 130, and the memory devices 120 may be implemented as separate dies within the same package. In other embodiments, they are implemented in their own respective packages. The serial data buffers 130 and memory devices 120 may be embodied as respective integrated circuits mounted on a common printed circuit board of a memory module. In further embodiments, the memory system 100 may comprise a disaggregated memory system 100 in which the serial data buffers 130 and memory devices 120 are physically remote from the memory controller 110 and may be distributed at different locations. Furthermore, serial data buffers 130 and their connected memory devices 120 may be physically remote from each other within the same memory system 100.

The memory controller 110 receives a set of controller input packets via one or more memory controller input lines 190 and sends host-side input packets comprising packetized commands or write data to a set of serial data buffers 130 via respective downstream communication lines 140. The packetized commands include a header portion specifying a type of command (e.g., write, read, refresh, etc.) and a content portion specifying a memory address (for read/write command) or other information. In response to read commands, the memory controller 110 receives host-side output packets encoding read data from the set of serial data buffers 130 via respective upstream communications lines 150. The memory controller 110 generates controller output packets on one or more memory controller output lines 195 based on the host-side output packets. In an embodiment, the controller input packets and the controller output packets conform to an OpenCAPI, CXL, or other similar protocol. The memory controller 110 may similarly communicate with additional sets of serial data buffers (not shown) via other channels 180.

The serial data buffers 130 buffer and decode the host-side input packets received via the downstream communication lines 140 and send commands and write data to the memory devices 120 via unidirectional serial input lines (D) 160. In response to read commands, the serial data buffers 130 read from the memory devices 120 via unidirectional serial output lines (Q) 170 and transfer the read data (as host-side output packets) to the memory controller 110 via the upstream communication lines 150.

The serial data buffers 130 may receive the packetized commands as high-level commands that do not necessarily specify specific timing of the associated memory operations. The serial data buffers 130 then control timing of memory operation commands and write data sent to the memory devices 120 to meet timing specifications of the memory devices 120. For example, in response to a read or write command packet, a serial data buffer 130 issues an activate command to activate an appropriate row of a memory device 120 prior to issuing the read or write operation in accordance with timing requirements of the memory device 120. In some cases, the serial data buffer 130 may issue memory commands or write data to the memory device 120 in a different order than it receives the corresponding packets from the memory controller 110. The serial data buffers 130 furthermore may perform transformations of the command addresses, write data, and/or the read data to facilitate functions such as row hammer mitigation, encryption, and decryption, as explained in further detail below.

The memory devices 120 comprise DRAM (dynamic random-access memory) devices that have separate unidirectional serial input ports (D) and unidirectional serial output ports (Q) that enable the memory devices 120 to receive input commands or write data at the input port D while concurrently outputting read data on the output port Q. Each memory device 120 is identified by a chip identifier (CID) (or alternatively, a package identifier (DDPID)). The memory devices 120 each include one or more memory bank groups comprising a set of memory banks. Each of the memory banks comprises a two-dimensional array of memory cells organized into rows and columns. Thus, the complete memory address of an individual memory cell may be characterized by a chip identifier, a bank group, a bank address, a row address, and a column address. Because many memory commands are applicable to an entire row (or in some cases, an entire bank, bank group, or chip identifier), some commands may identify ranges of addresses associated with the command.

A single serial data buffer 130 may be coupled over shared D lines 160 and Q lines 170 to multiple memory devices 120 having different chip identifiers. In the illustrated memory system 100, the memory devices 120 are organized into four groups of five memory devices 120. Here, each memory device 120 in a group shares the same chip identifier (e.g., CID=1, CID=2, CID=3, CID=4) and each memory device 120 in a group is coupled to a different serial data buffer 130 (e.g., SDB1, SDB2, SDB3, SDB4, SDB5). In alternative configurations, the memory system 100 may have a different number of serial data buffers 130 and/or a different number of memory devices 120 coupled to each of the serial data buffers 130.

In this architecture, data reads and writes may involve data words that are stored in a distributed manner across multiple memory devices 120. In operation, the memory controller 110 issues the same read or write command referencing the same memory address to multiple serial data buffers 130 over their respective downstream communication lines 140. Following a write command issued to multiple serial data buffers 130, the memory controller 110 then sends different portions of the write data word to different serial data buffers 130 over their respective downstream communications lines 140. The serial data buffers 130 write their respectively received portions of the write data word to one of the coupled memory devices 120. Similarly, following a read command issued to multiple serial data buffers 130, each of the serial data buffers 130 reads from one of the coupled memory devices 120 to obtain different portions of the requested read data word. The serial data buffers 130 then each send the different portions of the read data word to the memory controller 110 via the respective upstream communication lines 150.

In the described configuration, a rank includes the set of serial data buffers 130 that receive the same command from the memory controller 110 and the collective set of memory devices 120 that the serial data buffers 130 access based on that command. Thus, a packetized command from the memory controller 110 operates on a set of memory devices 120 in a single rank and data words are spread across memory devices 120 in the same rank.

The write data words written to the memory devices 120 may be encoded according to an error correction scheme that enables detection and correction of a limited number of corrupted bits. In an embodiment, the memory system 100 operates with a rank configuration and error correction scheme that enables detection and recovery of an entire data word if a corrupted portion of the data word is limited to a single memory device 120 or if a single memory device 120 fails. Examples of such an error correction schemes include Chipkill and Single Device Data Correction. In other embodiments, a different type of error correction scheme may be employed that does not necessarily enable recovery of a fully corrupted device 120. For example, a different error detection or correction scheme may be designed to enable detection and/or recovery of up to a certain limited number of corrupted data bits that may be less than the width of the data word portion written to each device.

Figure 2:
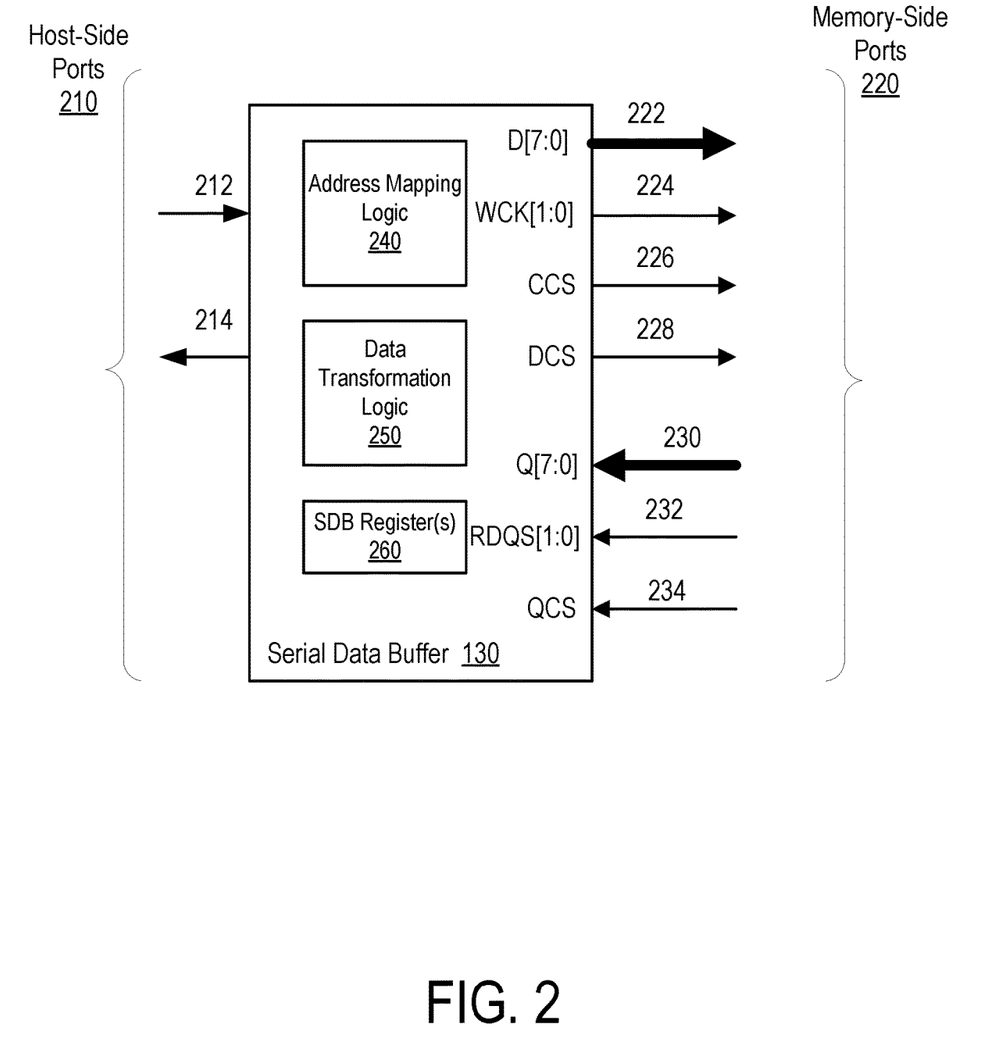
FIG. 2 is a block diagram illustrating an example embodiment of a serial data buffer for a memory system.

FIG. 2 is an example embodiment of a serial data buffer 130. The serial data buffer 130 includes host-side ports 210 for interfacing with the memory controller 110 and memory-side ports 220 for interfacing with the memory devices 120. The host-side ports 210 include one or more host-side input ports 212 for receiving host-side input packets from the memory controller 110 and one or more host-side output ports 214 for outputting host-side output packets to the memory controller 110. The memory-side ports 220 include the D port 222, a WCK port 224, a CCS port 226, A DCS port 228, the Q port 230, a RDQS port 232, and a QCS port 234.

The D port 222 may comprise a multi-bit port (e.g., 8 bits) for transmitting the memory device commands or write data to the memory devices 120 as described above. The WCK port 224 outputs a timing reference (e.g., a single-ended or differential clock signal) associated with commands or data transmitted on the D port 222. The CCS port 226 outputs a command enable signal indicating when the D port 222 is outputting a command. The DCS port 228 output a write data enable signal indicating when the D port 222 is outputting data.

The Q port 230 may comprise a multi-bit port (e.g., 8 bits) for receiving read data from the memory devices 120 into the serial data buffer 130 as described above. The RDQS port 232 receives a timing reference (e.g., a single-ended or differential clock signal) associated with data received on the Q port 230 from the memory device 120. The QCS port 234 receives a read data enable signal indicating when data is being transmitted to the serial data buffer 130 on the Q port 230.

The serial data buffer 130 also includes address mapping logic 240, optional data transformation logic 250, and one or more registers 260. The address mapping logic 240 maps an input command address referenced in a host-side input packet to an output command address for sending to a memory device 120. The mapping may involve changing one or more of the chip identifier, bank group, bank address, or row address based on a predefined function. The predefined function generally enforces a one-to-one remapping so that each possible input address in the memory address space maps to a unique output address within the memory address space of the memory devices 120. For example, in an embodiment, the address mapping logic 240 comprises a circular shift register that applies a circular shift (e.g., left circular shift or right circular shift) to a row address or other portion of the input command address. In another embodiment, the address mapping logic 240 comprises a linear feedback shift register (LFSR) or other logic for generating pseudo-random mappings. In yet another embodiment, the address mapping logic 240 comprises hashing logic that applies a hash function to at least one component of the input command address. In further embodiments, the address mapping logic 240 applies a different function or a combination of functions.

The specific function may be controlled based on a value stored to a register 260 of the serial data buffer 130. This register 260 may be programmed at manufacturing or test time in a persistent manner so that the mapping function cannot be changed once configured. In one embodiment, the register 260 is not readable by the memory controller 110 so that the remapping function is not externally discoverable. In an alternative embodiment, the register 260 may be programmable by the memory controller 110.

In the memory system 100 of FIG. 1, each of the serial data buffers 130 (e.g., SDB1, . . . , SDB5) may be configured to execute a different address remapping function. Thus, when a set of serial data buffers 130 receive a packetized input command referencing a common memory address, the set of serial data buffers 130 output respective memory device commands referencing different memory addresses. For example, in a write command, different portions of the data word are written to memory locations that vary in at least one of their row addresses, bank addresses, bank groups, or chip identifiers.

In an embodiment, the remapping functions may be designed to mitigate a row hammer effect in which repeated accesses to the same row of a memory device 120 may corrupt data of adjacent rows. Here, the remapping functions are designed such that input addresses mapped to adjacent rows of one memory device 120 are mapped to non-adjacent rows of the other memory devices 120 in the same rank. Thus, any data corruption that occurs from a row hammer affects different data words in different memory devices 120 and only a portion of each data word is potentially affected. In other words, the potentially corrupted portion of any one data word is limited the bits stored to a single memory device 120. Under a sufficient error detection and correction scheme (e.g., Chipkill or Single Device Data Correction), the entire data words can still be recovered in this scenario. Even without a Chipkill type of error detection and correction capability, the remapping functions can sufficiently reduce the number of row hammer errors associated with a given input address to improve resistance to row hammer errors when employing other types of error detection and correction techniques. For example, in alternative embodiments, an on-die ECC within the memory device 120 may be used. Examples of remapping operations are described in further detail below with reference to FIGS. 3-4 below.

The data transformation logic 250 transforms write data received in a host-side input packet or read data received on the Q port 230 based on a transformation function. For example, the data transformation logic 250 may generate encrypted write data for writing to a memory device 120 and may decrypt read data read from the memory device 120. Here, encryption and decryption may be performed based on a security key stored to a register 260 of the serial data buffer 130. The register 260 may be programmed at manufacturing or test time, or may be programmable by the memory controller 110. In one embodiment, the register is not readable by the memory controller 110 so that the encryption key is not externally discoverable.

In an embodiment, the mapping logic 240 and the data transformation logic 250 may operate based on the same register data. For example, the mapping logic 240 may be configured to derive the mapping function (e.g., by computing a hash) from an encryption key that is also used to perform encryption and decryption. Alternatively, the mapping logic 240 may derive the mapping function from a hash of the stored encryption key and a separately stored serial data buffer identifier.

The data transformation logic 250 may be optionally omitted. For example, in some embodiments, encryption/decryption may instead be performed at the memory controller 110 or the memory devices 120. Alternatively, the memory system 100 may operate without encryption/decryption.

Figure 3:
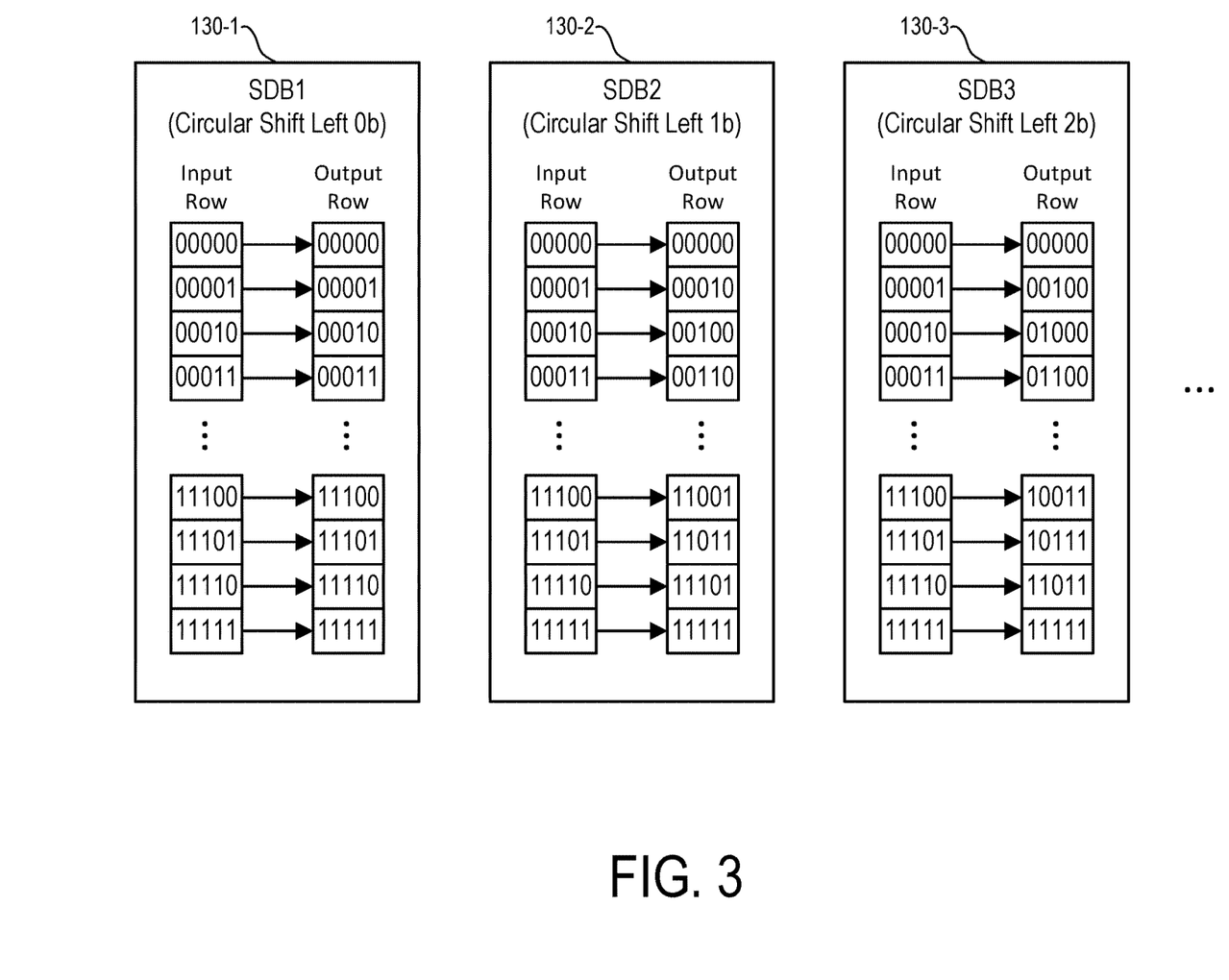
FIG. 3 is a diagram illustrating an example operation of address remapping functions in a set of serial data buffers of a memory system.

FIG. 3 illustrates an example of an address re-mapping operation performed by a set of serial data buffers 130. Here, the mapping function comprises a circular shift left applied to a 5-bit binary row address. Each of the serial data buffers 130 is configured with a different function parameter that results in a different shift amount. Specifically, a first serial data buffer 130-1 applies a circular left shift value of 0, a second serial data buffer 130-2 applies a circular left shift value of 1, and a third serial data buffer 130-3 applies a circular left shift value of 2. As can be seen, the neighboring rows of any output row address are mapped from different input row addresses by each of the serial data buffers 130.

Figure 4:
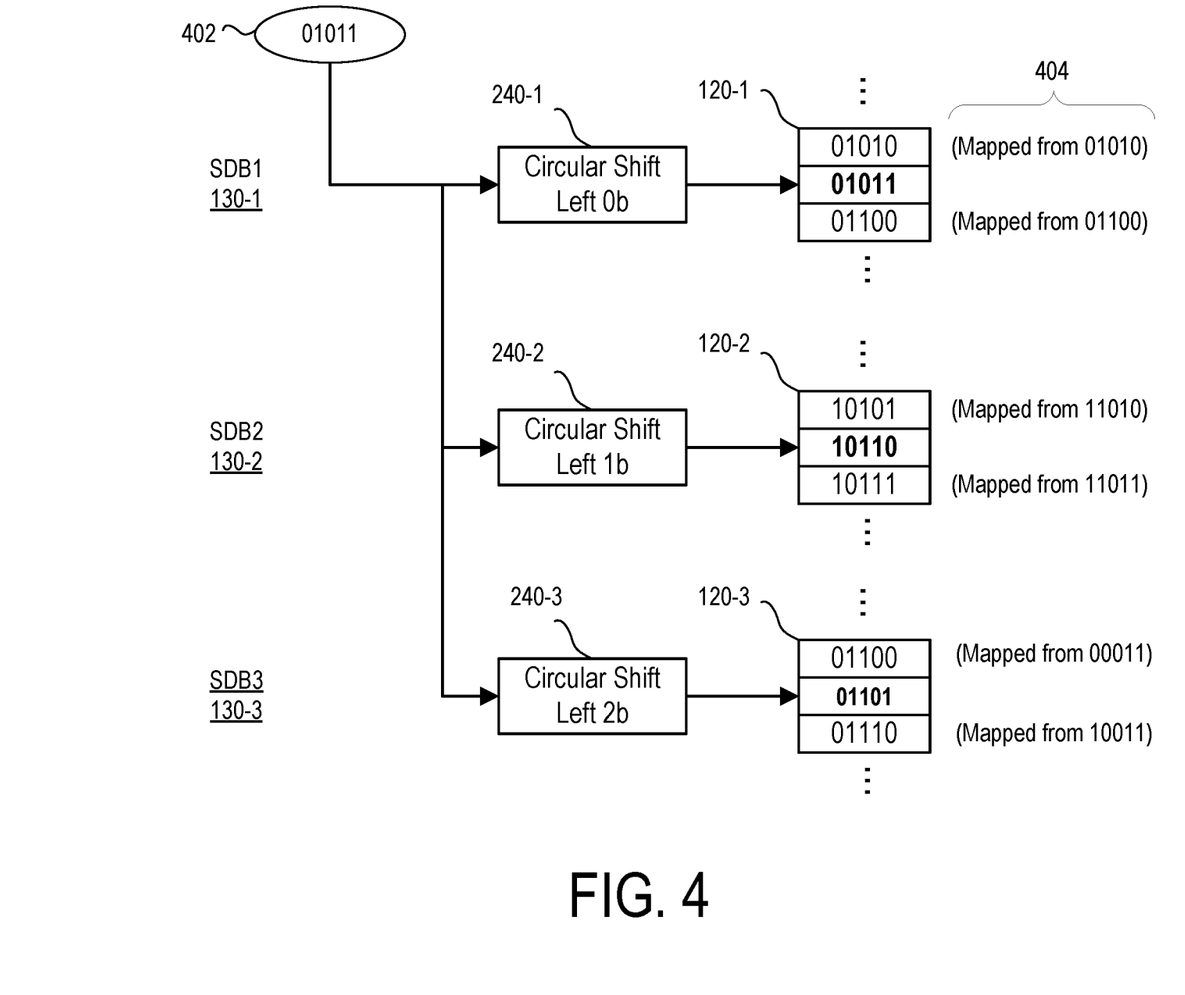
FIG. 4 is a diagram illustrating another example operation of address remapping functions in a set of serial data buffers of a memory system.

FIG. 4 illustrates an example of an address re-mapping operation as it affects a row hammer attack. Here, the memory controller 110 repeatedly issues commands 402 associated with an input row address 01011. The serial data buffers 130 (e.g., serial data buffers 130-1, 130-2, 130-3) each include mapping logic 140 (e.g., mapping logic 140-1, 140-2, 140-3) that apply different re-mapping functions based on a circular left shift of varying amounts. As a result, the row hammer targets row 01011 of a first memory device 120-1, row 10110 of a second memory device 120-2, and row 01101 of a third memory device 120-3. FIG. 4 also illustrates the rows adjacent to the rows targeted by the row hammer in each memory device 120 that can potentially become corrupted. These potentially corrupted rows contain portions of data words mapped from different respective input memory addresses 404. As can be seen, each of the potentially corrupted memory rows map back to different input memory addresses and therefore each store portions of different data words. In other words, for any given data word, the potentially corrupted data from the row hammer attack is limited to the bits in a single memory device 120. Thus, any corrupted data word portions can be recovered using an error correction scheme designed to detect and correct errors limited to a single memory device 120 (e.g., Chipkill or Single Device Data Correction). Furthermore, different error correction schemes may still enable recovery from errors that are limited to those that the specific scheme is designed to detect and correct.

While FIGS. 3-4 illustrate just one example of a set of remapping functions, multiple alternative functions can be employed in the memory system 100. For example, the serial data buffers 130 may equivalently perform right circular shifts by varying amounts instead of left circular shifts. Alternatively, the serial data buffers 130 may implement various hash functions, linear feedback shift function, or other functions that provide unique one-to-one mappings of addresses within the memory address space. In further embodiments, the remapping function may affect one or more of the bank address, bank group, and/or chip identifier instead of, or in addition to, the row address.

In other alternative embodiments, a mapping scheme may include a set of functions that ensure that a pair of input addresses mapped to adjacent rows of one memory device 120 are mapped to non-adjacent rows in the other memory devices 120 in the same rank with at least n rows in between them wherein n≥2. These mapping scheme provides further protection against row hammer errors that may occur across multiple neighboring rows.

In further embodiments, the serial data buffers 130 may employ different remapping functions for different received command packets. For example, different functions may be applied to input commands affecting different ranks. Furthermore, different functions may be applied to input commands referencing different chip identifiers, bank groups, or bank addresses.

Figure 5:
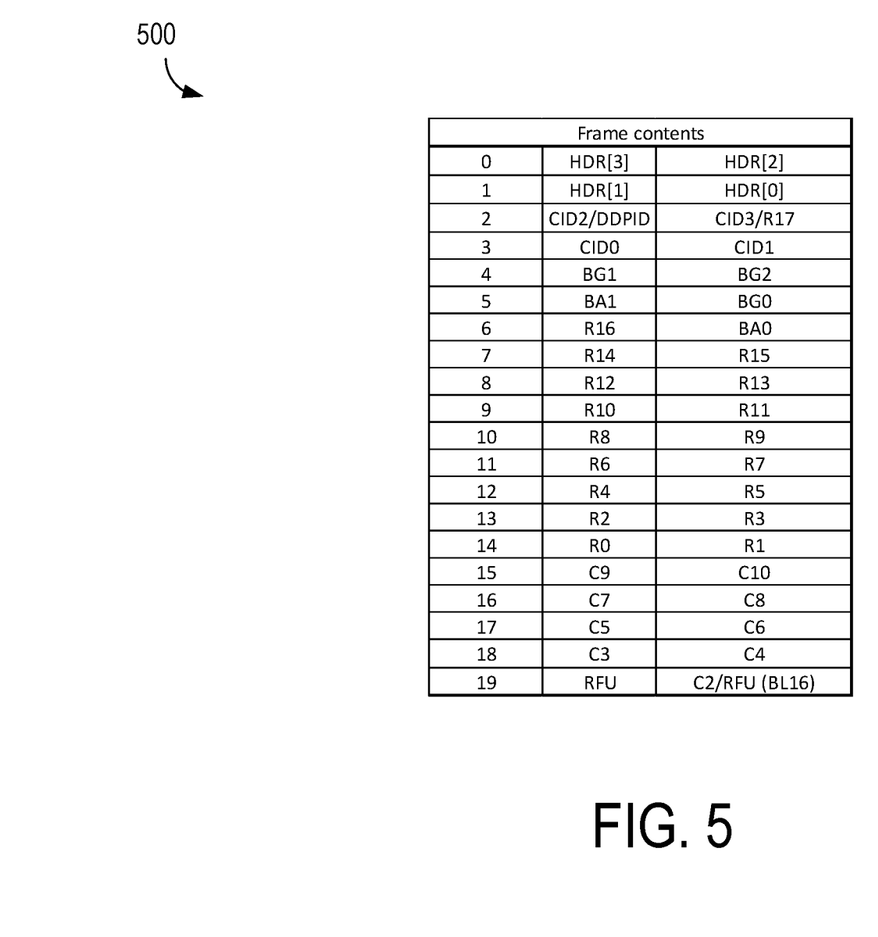
FIG. 5 is a table illustrating example host-side input packets issued by a memory controller to a serial data buffer.

FIG. 5 illustrates an example embodiment of a structure 500 for a host-side input packet for a serial data buffer 130. In this example, the host-side input packet includes a set of header bits (HDR) that encode the type of command together with address bits and/or other control and command bits. For example, for a read or write command, the host-side input packet may specify information such as burst length (BL), and an address associated with command specified by chip identifier (CID) (or a package identifier DDPID), the bank group (BG), bank address (BA), row address (R), and column address (C). The specific information encoded in the host-side input packet may vary depending on whether the host-side input packet encodes write data or a memory command and depending on the type of command.

Figure 6:
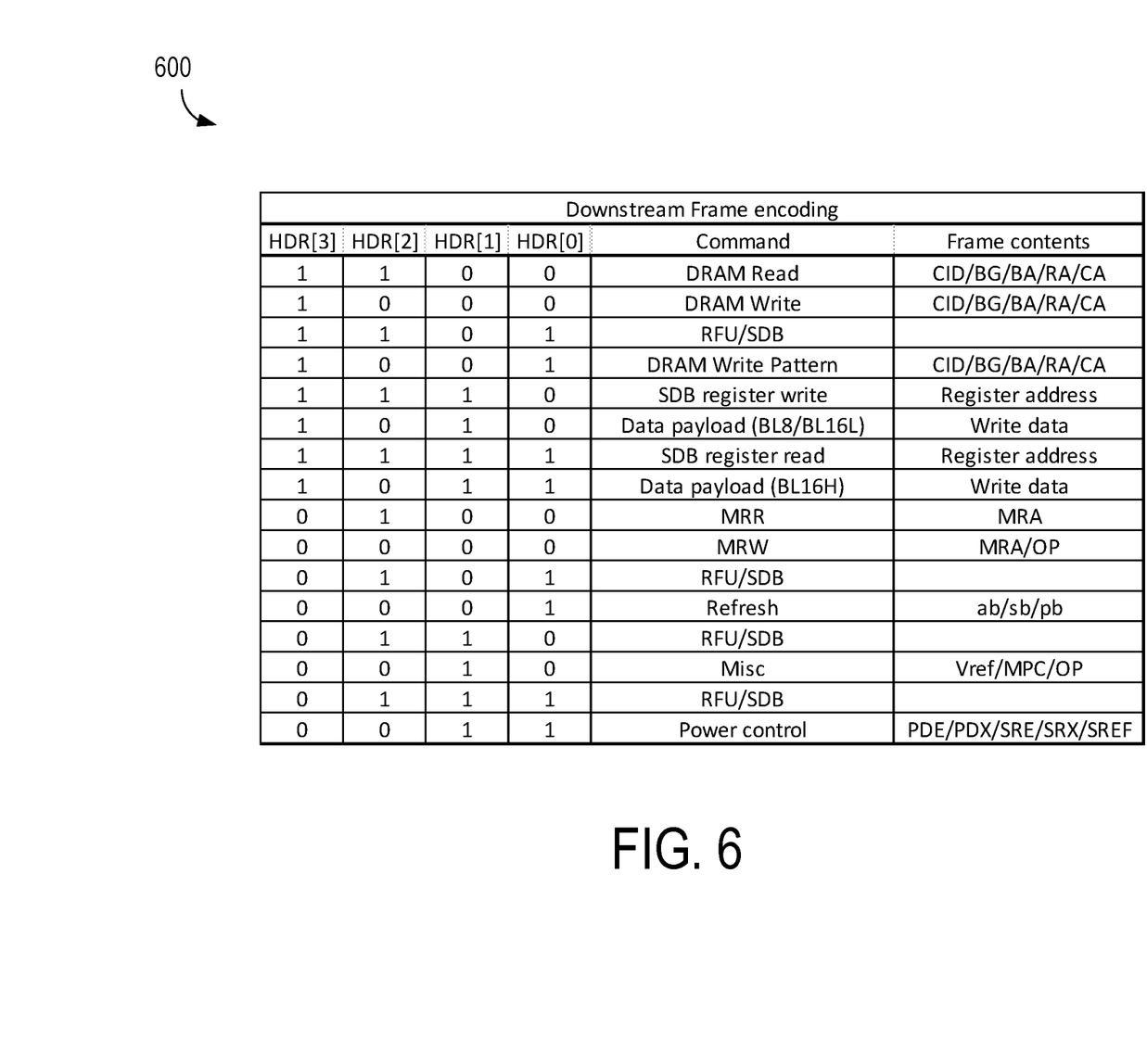
FIG. 6 is a table illustrating an example encoding scheme for encoding commands in a header portion of a host-side input packet.

FIG. 6 is an example embodiment of an encoding table 600 for encoding varying types of command using the header bits of host-side input packet. In addition to read and write commands discussed above, the host-side input packet can encode other types of command such as a write pattern command, a mode register read (MRR) command, a mode register write (MRW) command, a refresh command, a power control command, or other miscellaneous commands.

Figure 7:
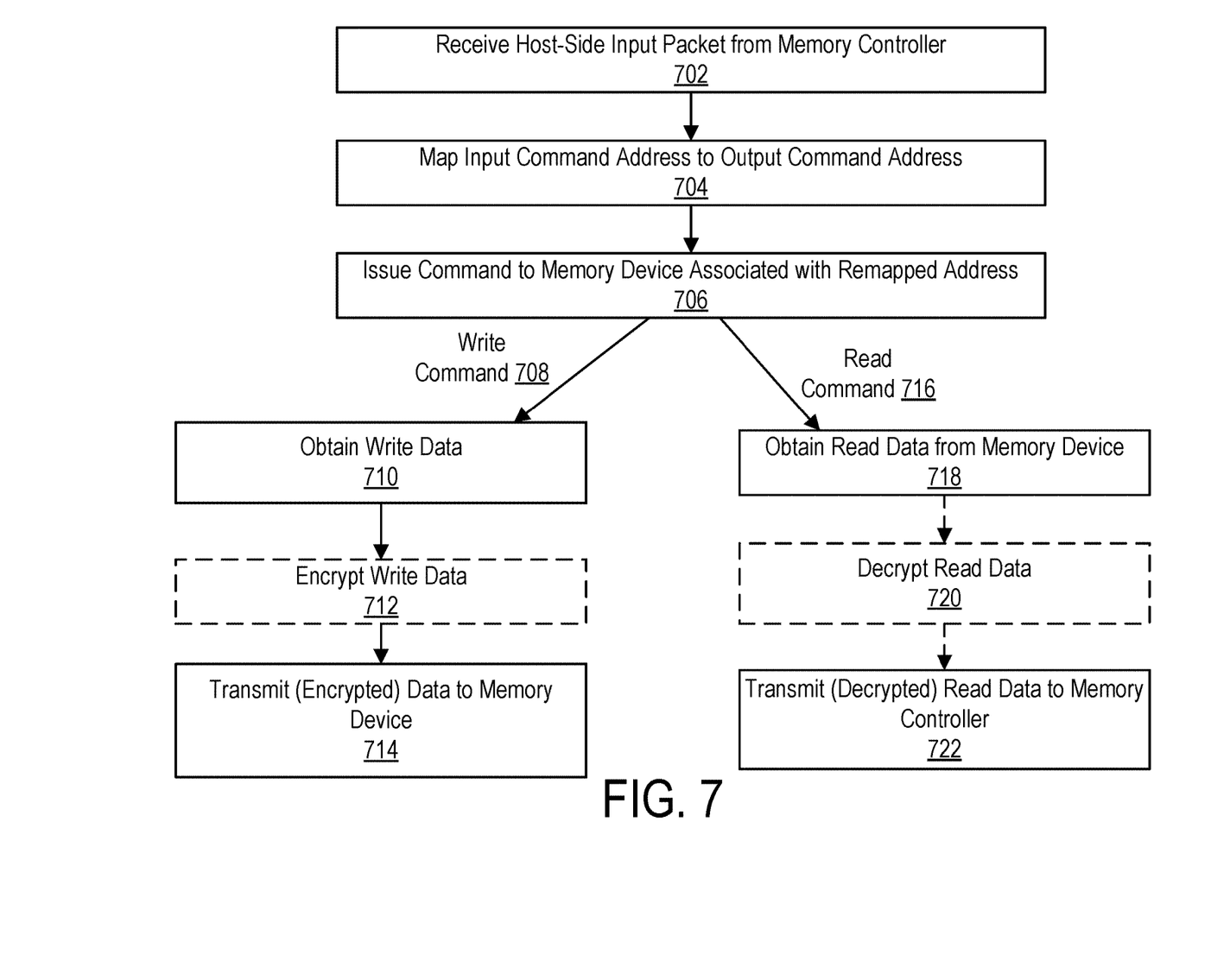
FIG. 7 is a flowchart illustrating an example embodiment of a process for operating a serial data buffer of a memory system.

FIG. 7 is a flowchart illustrating an example embodiment of a process for operating a serial data buffer 130. The serial data buffer 130 receives 702 host-side input packets from a memory controller 110 via a unidirectional host-side input port. The serial data buffer 130 maps 704 an input command address of the host-side input packet to an output command address based on a mapping function. The serial data buffer 130 transmits 706 the command with the remapped command address to a memory device 120 corresponding to the remapped address. For a write command 708, the serial data buffer 130 obtains 710 the write data from the memory controller 110, optionally encrypts 712 the write data, and transmits 714 the (optionally encrypted) write data to the memory device 120 following the write command 708. For a read command 716, the serial data buffer 130 obtains 718 the read data from the memory device 120 following the read command 716, optionally decrypts 720 the read data, and transmits 722 the (decrypted) read data back to the memory controller 110.

Upon reading this disclosure, those of ordinary skill in the art will appreciate still alternative structural and functional designs and processes for the described embodiments, through the disclosed principles of the present disclosure. Thus, while embodiments and applications of the present disclosure have been illustrated and described, it is to be understood that the disclosure is not limited to the precise construction and components disclosed herein. Various modifications, changes and variations which will be apparent to those skilled in the art may be made in the arrangement, operation and details of the method and apparatus of the present disclosure herein without departing from the scope of the disclosure as defined in the appended claims.

What is claimed is:

1. A memory module comprising:
a plurality of memory devices; and
a plurality of serial data buffers coupled to respective corresponding memory devices, each of the serial data buffers to receive a same input address associated with a memory command, each of the serial data buffers to apply respective different functions to the same input address to generate respective remapped addresses, and each of the serial data buffers to output the respective remapped addresses for the memory command to the respective corresponding memory devices.

2. The memory module of claim 1, wherein the respective different functions are persistently programmed to the plurality of serial data buffers.

3. The memory module of claim 1, wherein the respective different functions are stored to respective registers of the plurality of serial data buffers that are programmable by a memory controller.

4. The memory module of claim 1, wherein the respective different functions each remap at least one of a chip identifier, a bank group, a bank address, a row address, or a column address associated with the memory command.

5. The memory module of claim 1, wherein the respective different functions operate such that a pair of input addresses that are mapped to adjacent rows in one of the plurality of serial data buffers are mapped to non-adjacent rows by remaining serial data buffers.

6. The memory module of claim 1, wherein the respective different functions each apply a circular shift of a different amount to a row address of the same input address.

7. The memory module of claim 1, wherein the respective different functions each apply a different hash function to at least a portion of the same input address.

8. The memory module of claim 1, wherein the respective different functions each apply a linear feedback shift function to at least a portion of the same input address.

9. The memory module of claim 1, wherein the respective different functions applied by a single serial data buffer vary when accessing different ranks of the memory devices.

10. The memory module of claim 1, wherein the respective different functions applied by a single serial data buffer vary when accessing different banks of the memory devices.

11. The memory module of claim 1, wherein each of the plurality of serial data buffers are further configured to receive respective input write data and to encrypt the respective input write data to generate respective output write data in encrypted form.

12. The memory module of claim 11, wherein each of the plurality of serial data buffers store respective encryption keys applied to encrypt the respective input write data.

13. The memory module of claim 12, wherein the respective different functions are selected based on the respective encryption keys stored to the plurality of serial data buffers.

14. The memory module of claim 13, wherein the respective different functions are selected based on a hash of the respective encryption keys stored to the plurality of serial data buffers.

15. A method for operating a memory module comprising:
receiving, by a plurality of serial data buffers, a same input address associated with a memory command;
applying by the plurality of serial data buffers, respective different functions to the same input address to generate respective remapped addresses for the memory command; and
outputting, by the serial data buffers, the respective remapped addresses for the memory command to respective corresponding memory devices.

16. The method of claim 15, further comprising:
persistently storing, by each of the plurality of serial data buffers, respective different parameter values that control the respective different functions.

* * * * *